United States Patent

Spits et al.

(10) Patent No.: US 8,912,847 B2
(45) Date of Patent: Dec. 16, 2014

(54) POWER AMPLIFIER CIRCUIT AND FRONT END CIRCUIT

(75) Inventors: Erwin Spits, Utrecht (NL); Leon C. M. van den Oever, Rosmalen (NL)

(73) Assignee: Epcos AG, Munich (DE)

( * ) Notice: Subject to any disclaimer, the term of this patent is extended or adjusted under 35 U.S.C. 154(b) by 195 days.

(21) Appl. No.: 13/513,239

(22) PCT Filed: Dec. 3, 2009

(86) PCT No.: PCT/EP2009/066355
§ 371 (c)(1),
(2), (4) Date: Jun. 1, 2012

(87) PCT Pub. No.: WO2011/066861
PCT Pub. Date: Jun. 9, 2011

(65) Prior Publication Data
US 2012/0235735 A1    Sep. 20, 2012

(51) Int. Cl.
*H03F 3/68* (2006.01)

(52) U.S. Cl.
USPC .................. 330/126; 330/295; 330/124 R

(58) Field of Classification Search
USPC ...................... 330/126, 295, 124 R
IPC ........................................ H03F 3/68
See application file for complete search history.

(56) References Cited

U.S. PATENT DOCUMENTS

| | | | |
|---|---|---|---|
| 3,497,604 A * | 2/1970 | Slaats et al. | 84/600 |
| 4,733,195 A | 3/1988 | Tserng et al. | |
| 5,021,756 A | 6/1991 | Tajima et al. | |
| 5,635,870 A * | 6/1997 | David | 330/52 |
| 6,498,926 B1 | 12/2002 | Ciccarelli et al. | |
| 6,636,114 B2 * | 10/2003 | Tsutsui et al. | 330/51 |
| 6,900,695 B2 | 5/2005 | Ouacha | |
| 6,960,959 B2 | 11/2005 | Komatsu et al. | |

(Continued)

FOREIGN PATENT DOCUMENTS

| | | |
|---|---|---|
| EP | 1345322 A1 | 9/2003 |
| EP | 1796203 A1 | 6/2007 |

(Continued)

OTHER PUBLICATIONS

Office action corresponding to co-pending Japanese Patent Application Serial No. 2012-541326, Japanese Patent Office, dated May 7, 2013; (5 pages).

(Continued)

*Primary Examiner* — Patricia Nguyen
(74) *Attorney, Agent, or Firm* — Nixon Peabody LLP

(57) ABSTRACT

A power amplifier circuit (DIPPA), comprising a driver stage (DR) which is applicable to provide a preamplified driver signal (S_DR) dependent on a predetermined transmit signal. The power amplifier circuit (DIPPA) comprises also a frequency selector (DIP) which is electrically coupled to the driver stage (DR) and which is applicable to separate the driver signal (S_DR) into a first and second signal (S_1, S_2). The first signal (S_1) is associated to a first predetermined and the second signal (S_2) is associated to a second predetermined frequency band. The power amplifier circuit (DIPPA) comprises at least a first and second power amplifier stage (PA1, PA2). The first and second power amplifier stage (PA1, PA2) are electrically coupled to the frequency selector (DIP). The first and second power amplifier stage (PA1, PA2) is operable to provide a first and second amplified signal (S_A1, S_2), respectively, dependent on the first and second signal (S_1, S_2), respectively.

8 Claims, 2 Drawing Sheets

(56) References Cited

U.S. PATENT DOCUMENTS

Figure 1:
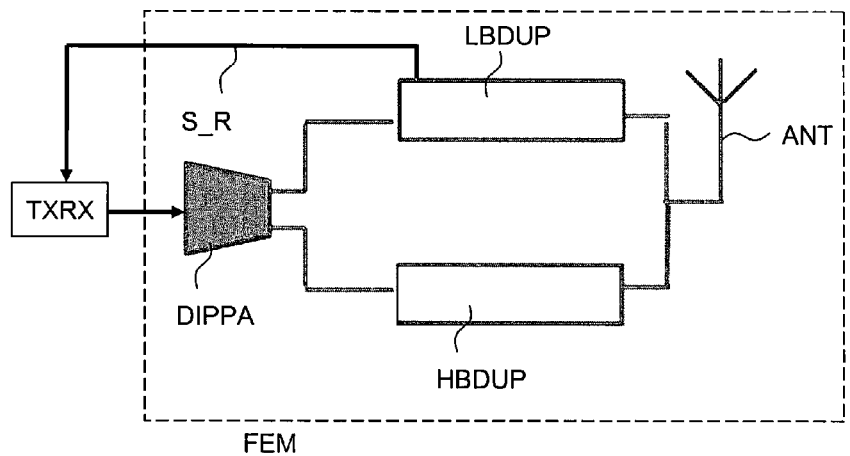

| | | | |
|---|---|---|---|
| 7,230,484 B2* | 6/2007 | Hirtzlin et al. | 330/124 R |
| 7,298,206 B2* | 11/2007 | Pickerd et al. | 330/126 |
| 7,315,206 B2 | 1/2008 | Leyten et al. | |
| 7,436,259 B2* | 10/2008 | Haramoto et al. | 330/52 |
| 7,860,454 B2* | 12/2010 | Moloudi et al. | 455/20 |
| 2001/0034217 A1 | 10/2001 | Loke et al. | |
| 2008/0240000 A1 | 10/2008 | Kidd | |
| 2009/0201084 A1 | 8/2009 | See et al. | |
| 2009/0219087 A1 | 9/2009 | Auvray | |

FOREIGN PATENT DOCUMENTS

| | | |
|---|---|---|
| JP | S61-81017 A2 | 6/1994 |
| JP | 0767061 B2 | 7/1995 |
| JP | 0770936 B2 | 7/1995 |
| JP | 2000-183664 A | 6/2000 |
| JP | H4-304707 A | 9/2000 |
| JP | 2002-208874 A | 7/2002 |
| JP | 2006-506879 A | 2/2006 |
| JP | 2007-534257 A | 11/2007 |
| WO | 99/30426 A1 | 6/1999 |

OTHER PUBLICATIONS

Japanese Examination Report corresponding to co-pending Japanese Patent Application No. 2012-541326, Japanese Patent Office, dated Nov. 12, 2013; (4 pages).

International Search Report corresponding to co-pending International Patent Application Serial No. PCT/EP2009/066355, European Patent Office, dated Sep. 27, 2010; (4 pages).

International Written Opinion corresponding to co-pending International Patent Application Serial No. PCT/EP2009/066355, European Patent Office, dated Sep. 27, 2010; (6 pages).

Focus Microwaves "Application Note 59: The Effects of Harmonic Tuning on EVM"; Focus Microwaves Inc.; Dated Sep. 2006; (3 pages).

Lim J.-S. et al. "A Power Amplifier with Efficiency Improved Using Defected Ground Structure"; IEEE Microwave and Wireless Components Letters, vol. 11, No. 4, Dated Apr. 2001, pp. 170-172; (3 pages).

Shapiro E. S. et al. "A High Efficiency Traveling-Wave Power Amplifier Topology Using Improved Power-Combining Techniques"; IEEE Microwave and Guided Wave Letters, vol. 8, No. 3, Dated Mar. 1998, pp. 133-135; (3 pages).

Simpson G. "A Comparison of Harmonic Tuning Methods for Load Pull Systems"; Maury Microwave Inc.; Dated Jul. 2009; (7 pages).

Walsh K. et al. "3G/4G Multimode Cellular Front End Challenges"; RFMD, Dated 2009; (5 pages).

Wang W. "A Triplexing Amplifier based on CRLH Structures incorporating active elements"; GEMIC; Dated Mar. 2009; (11 pages).

* cited by examiner

POWER AMPLIFIER CIRCUIT AND FRONT END CIRCUIT

CROSS-REFERENCE TO RELATED APPLICATIONS

This application is a U.S. National Stage of International Application No. PCT/EP2009/066355, filed Dec. 3, 2009, which is incorporated herein by reference in its entirety.

The present invention relates to a power amplifier circuit and a front end circuit comprising the power amplifier circuit.

Front end modules are generally known for the transmission and reception of wireless communication signals for example in wireless communication devices as for example cellular phones. In this respect Universal Mobile Telecommunication System (UMTS) and GSM are generally known wireless communication standards.

The object of the invention is to provide a power amplifier circuit and a front end circuit, which facilitates an efficient operation and which is cost-effective.

These objects are achieved by the features of the independent claims. Aspects and several embodiments are subject to the dependent claims.

The invention according to a first aspect is distinguished by a power amplifier circuit for wireless communication devices, which comprises a driver stage with an input terminal and an output terminal. The driver stage is applicable to provide a preamplified driver signal at its output terminal dependent on a predetermined transmit signal at its input terminal. The power amplifier circuit further comprises a frequency selector with an input terminal and at least two output terminals. The frequency selector is electrically coupled to the output terminal of the driver stage via its input terminal and is operable to separate at least a first signal and a second signal from the driver signal. The first signal is associated to a first predetermined frequency band and the second signal is associated to a second predetermined frequency band. The power amplifier circuit also comprises at least a first power amplifier branch and a second power amplifier branch. Each power amplifier branch comprises an input terminal and an output terminal. The input terminal of the first power amplifier branch is electrically coupled to the first output terminal of the frequency selector. The input terminal of the second power amplifier branch is electrically coupled to the second output terminal of the frequency selector. The first power amplifier branch is operable to provide a first amplified signal at its output terminal dependent on the first signal and the second power amplifier branch is operable to provide a second amplified signal at its output terminal dependent on the second signal.

This contributes to an efficient power amplifier circuit, which may be used for example in cellular phones, wireless network cards, etc. The power amplifier circuit may be supplied with transmit signals comprising signals of the first and second frequency band, as for example UMTS or GSM frequency bands. The power amplifier circuit may be used only for data transmission in transmit direction. The transmit direction corresponds to a signal direction from the input terminal of the driver stage to the particular output terminals of the first and second power amplifier branch.

Each of the at least first and second power amplifier branch may comprise at least one power amplifier stage, as for example a radio frequency amplifier stage. Each power amplifier branch is operable to increase the output power of the signals to be transmitted via an antenna.

The frequency selector may be a diplexer, diplexing the preamplified signal provided by the driver stage into the first and second signal in the transmit direction of the power amplifier circuit. The power amplifier circuit may comprise more than two power amplifier branches. The number of output terminals of the particular frequency selector corresponds to the number of power amplifier branches. When processing for example signals of three frequency bands, the frequency selector may be a triplexer, providing a particular signal of a predetermined frequency band at each of its three output terminals. The frequency selector may be a passive or active element with additional power amplifiers.

Each power amplifier branch is associated to a predetermined frequency band. By this, each power amplifier branch and its components, as for example the power amplifier stages, may be optimized in amplifying signals of the associated frequency band. This contributes to increasing the efficiency of the power amplifier circuit.

In an embodiment of the first aspect the driver stage comprises at least one wideband amplifier which is applicable to preamplify the supplied predetermined transmit signal over a wide range of frequencies. The wide range of frequencies covers the at least first and second predetermined frequency bands. The driver stage comprises only one input terminal and one output terminal and is applicable to preamplify signal parts of the transmit signal associated to the first and second frequency band. The at least one wideband amplifier of the driver stage may be a travelling wave amplifier.

In a further embodiment of the first aspect the frequency selector comprises at least two power amplifiers, which are operable to amplify the driver signal and/or the first signal and/or the second signal. The frequency selector may comprise right handed transmission line elements and/or composite right left handed transmission line elements with power amplifiers electrically arranged between those transmission line elements. This contributes to ensuring a separation of the first and second signal from the preamplified driver signal.

In a further embodiment of the first aspect each of the first and/or second power amplifier branch comprises at least one narrow band power amplifier. While a wideband amplifier is operable to boost signals over a wide range of frequencies, the narrow band amplifier is operable to boost only a signal in a specific narrow range of frequencies, as for example the first frequency band and second frequency band, respectively. All other frequencies are excluded from amplification by the narrow band power amplifier. The narrow-band amplifier may also comprise linear characteristics and is operable to output signals with only limited or no harmonic distortion. This basically prevents harmonics in the particular output signal of the power amplifier circuit. Furthermore, the narrow-band amplifier may also constitute harmonic tuning and by this, may be operable to suppress harmonics due to non-linearities of the previous components with respect to the transmit direction.

In a further embodiment of the first aspect the power amplifier circuit further comprises at least a first and second bypass-path. The first bypass-path is associated to the first power amplifier branch and the second bypass-path is associated to the second power amplifier branch. The particular bypass-path is operable to bypass the input terminal and output terminal of the particular power amplifier branch.

Additionally, the power amplifier components of the particular power amplifier branch, as for example the power amplifier stage, may be decoupled from their supply voltage if the particular bypass is constituted. This contributes to reducing the power consumption of the power amplifier circuit. For activation or deactivation of the bypass, the particular bypass-path may comprise a particular switching element, for example a transistor, which may be controlled by a control logic of the particular wireless communication device.

In a further embodiment of the first aspect the driver stage and the frequency selector or the frequency selector and the first power amplifier stage and second power amplifier stage or the driver stage and the frequency selector and the first power amplifier branch and second power amplifier branch are integrated on a single-chip. This contributes to reducing a space requirement of the power amplifier circuit. The power amplifier circuit as single-chip may be realized for example in GaAs BiFET technology which is suitable for high-frequency applications. But also other suitable technology may be used.

The invention according to a second aspect is distinguished by a front end circuit for a wireless communication device which comprises a power amplifier circuit according to the first aspect. Furthermore, the front end circuit comprises at least a first duplexer and a second duplexer. Each of the first duplexer and second duplexer comprises an input terminal and an output terminal. The input terminal of the first duplexer is electrically coupled to the output terminal of the first power amplifier branch and the input terminal of the second duplexer is electrically coupled to the output terminal of the second power amplifier branch. Each of the first duplexer and second duplexer is operable to pass signals from its input terminal to its output terminal. The front end circuit further comprises a common antenna which is electrically coupled to the output terminal of the first duplexer and to the output terminal of the second duplexer.

Due to the use of the efficient power amplifier circuit, the front end circuit also facilitates an efficient operation. The front end circuit may be used in multiple-band mobile handsets for the 2G/3G/4G standards. The particular wireless communication device may also comprise more than one power amplifier circuit. The particular duplexer may comprise multiple band pass filters with one being configured to pass for example a first signal of a predetermined first frequency band, for example transmit frequency band, and to filter a second signal of a predetermined second frequency band, for example a receive frequency band. The particular duplexer may also be a switching element. In the transmit direction the particular duplexer is operable to pass signals from the particular power amplifier branch from its input terminal to the common antenna via its output terminal.

The terms "input terminal" and "output terminal" relate to the transmit direction of the power amplifier circuit and front end circuit.

Each of the first duplexer and second duplexer may comprise a transmit filter and a receive filter. The transmit filter of each duplexer comprises an input terminal and an output terminal. The input terminal of the transmit filter of the first duplexer is electrically coupled to the output terminal of the first power amplifier stage and the output terminal of the transmit filter of the first duplexer is electrically coupled to the common antenna. The input terminal of the transmit filter of the second duplexer is electrically coupled to the output terminal of the second power amplifier branch and the output terminal of the transmit filter of the second duplexer is electrically coupled to the common antenna.

In an embodiment of the second aspect the front end circuit comprises an antenna multiplexer with at least a first input terminal and a second input terminal and a single output terminal. The output terminal of the antenna multiplexer is electrically coupled to the common antenna. The first input terminal of the antenna multiplexer is electrically coupled to the output terminal of the first duplexer, in particular of the transmit filter of the first duplexer. The second input terminal of the antenna multiplexer is electrically coupled to the output terminal of the second duplexer, in particular of the transmit filter of the second duplexer. The antenna multiplexer is operable to combine the signals outputted from the first duplexer and second duplexer and to provide it to the common antenna in the transmit direction. The multiplexer may be a frequency selector according to the first aspect. The multiplexer may for example be a diplexer, triplexer, etc. The number of input terminals of the multiplexer corresponds to the number of duplexer electrically coupled to each input terminal of the multiplexer.

In the following, the disclosure is described in further detail with reference to the drawings, wherein FIG. 1 front end circuit,
FIG. 2 front end circuit with power amplifier circuit,
FIG. 3 frequency selector,
FIG. 4 another frequency selector.

Elements of the same design and function that appear in different illustrations are identified by the same reference character.

FIG. 1 depicts an embodiment of a front end circuit FEM which may be used in wireless or mobile communication devices as for example cellular phones in GSM or UMTS-networks.

The front end circuit FEM comprises a power amplifier circuit DIPPA, a first duplexer LBDUP and a second duplexer HBDUP and a common antenna ANT.

The power amplifier circuit DIPPA may be electrically coupled to a transceiver TXRX, for example a WCDMA-transceiver, of the particular wireless communication device. In a transmit direction, the transceiver TXRX supplies transmit signals associated to a predetermined frequency band to an input terminal of the power amplifier circuit DIPPA. In a receive direction, received signals typically bypass the power amplifier circuit DIPPA and are directly routed to a receive terminal of the transceiver TXRX.

The power amplifier circuit DIPPA comprises a first output terminal and a second output terminal. The first output terminal and second output terminal are electrically coupled to an input terminal of the first duplexer and second duplexer LBDUP, HBDUP, respectively. The first output terminal of the power amplifier circuit DIPPA is associated to a first frequency band, for example a transmit frequency band of GSM 900 covering a frequency range from 876 MHz to 915 MHz. The second output terminal of the power amplifier circuit DIPPA is associated to a second frequency band, for example a transmit frequency band of GSM 1900 covering a frequency range from 1850 MHz to 1910 MHz. The power amplifier circuit DIPPA provides a first amplified signal S_A1 and a second amplified signal S_A2 at its first output terminal and second output terminal, respectively.

The power amplifier circuit DIPPA may also comprise more than two output terminals and may also be electrically coupled to more than two duplexers.

The output terminal of each of the first duplexer LBDUP and second duplexer HBDUP is electrically coupled to the common antenna ANT. The coupling to the common antenna ANT may be established by an additional antenna multiplexer ADIP which is electrically arranged between the output terminals of the first and second duplexer LBDUP, HBDUP and a terminal of the common antenna ANT. The antenna multiplexer ADIP may be a diplexer. In the transmit direction, the provided transmit signals of the first frequency band and/or second frequency band are routed through the antenna multiplexer ADIP to the common antenna ANT.

Alternatively, the antenna multiplexer ADIP may be a conventional switch. Furthermore, the antenna multiplexer ADIP may be a balanced diplexer.

In the transmit direction, the first duplexer LBDUP is operable to route the first amplified signal S_A1 from its input terminal to its output terminal. For this purpose, the first duplexer LBDUP may comprise a transmit filter routing the first amplified signal S_A1 from the input terminal to the output terminal of the first duplexer LBDUP. The second duplexer HBDUP is operable to route the second amplified signal S_A2 from its input terminal to its output terminal. For this purpose, the second duplexer HBDUP may comprise another transmit filter routing the second amplified signal S_A2 from the input terminal to the output terminal of the second duplexer HBDUP.

In the receive direction, received signals are typically associated to different frequency bands than the associated transmit frequency bands, for example the receive frequency band of the GSM 900 covers frequencies from 921 to 960 MHz and the receive frequency band of the GSM 1900 covers frequencies from 1930 to 1990 MHz. Each of the first and second duplexer LBDUP, HBDUP may also comprise multiple band pass filters. One of the band pass filters, for example the transmit filter, may be configured to pass only signals of the particular transmit frequency band in the transmit direction. Another band pass filter, for example a receive filter, may be configured to only pass signals of the particular receive frequency band of the particular frequency band in the receive direction, whereas the passed signals of the particular receive frequency band are directly routed to the particular receive terminal of the transceiver TXRX and not to the input terminal of the particular duplexer LBDUP, HBDUP. This is illustrated in FIG. 1 by a separate receive signal path S_R routing the signals of the first receive frequency band from the first duplexer LBDUP directly to the transceiver TXRX.

Figure 2:
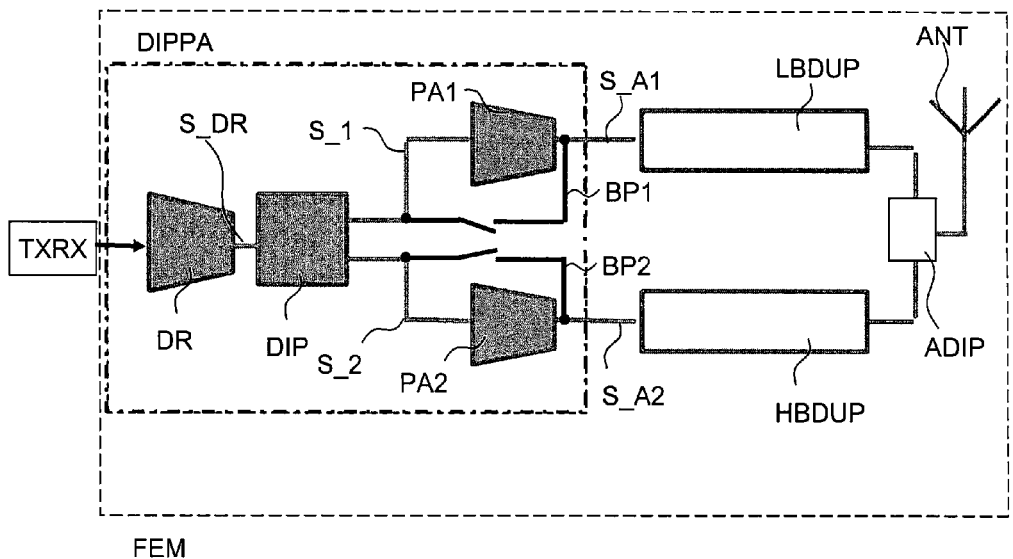

FIG. 2 depicts a further embodiment of the front end circuit FEM with the power amplifier circuit DIPPA which comprises a driver stage DR, a frequency selector DIP and a first power amplifier branch and a second power amplifier branch. The first power amplifier branch comprises for example a first amplifier stage PA1 and the second power amplifier branch comprises for example a second power amplifier stage PA2.

The driver stage DR comprises one input terminal and one output terminal. The input terminal of the driver stage DR is electrically coupled to an output terminal of the transceiver TXRX and by this supplied by the transmit signals from the transceiver TXRX. The driver stage DR may be operable to process, e.g. preamplify, the supplied transmit signals into appropriate driver signals S_DR which are further processed by subsequent components of the power amplifier circuit DIPPA. The driver stage DR may be a wideband driver which is operable to process transmit signals over a wide range of frequencies. For this purpose, the driver stage DR may comprise a wideband amplifier, for example a traveling wave amplifier. In particular, the driver stage DR may be operable to process transmit signals at least of the first frequency band and of the second frequency band.

Figure 3:
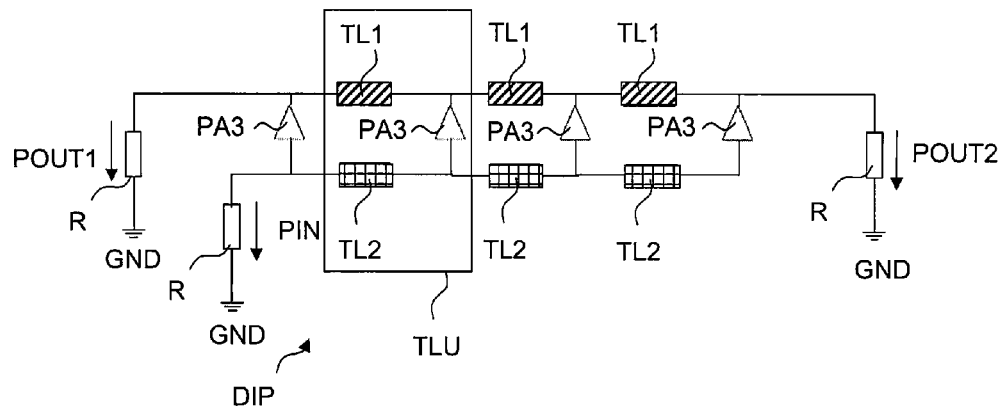

The driver stage DR provides the processed driver signal S_DR at its output terminal which is electrically coupled to an input terminal PIN of the frequency selector DIP (FIG. 3). The frequency selector DIP further comprises a first and second output terminal (POUT1, POUT2) (FIG. 3). The frequency selector DIP is operable to divide transmit signals provided at its input terminal PIN into a first signal S_1 at its first output terminal POUT1 and into a second signal S_2 at its second output terminal POUT2. The first signal S_1 and the second signal S_2 are associated to signals of the first frequency band and second frequency band, respectively. Ideally, the frequency selector DIP is operable to transfer none of the signals of the first frequency band to its second output terminal POUT2 and none of the signals of the second frequency band to its first output terminal POUT1. The frequency selector DIP is at least operable to provide dampened signals of the first frequency at its second output terminal POUT2 and is at least operable to provide dampened signals of the second frequency at its first output terminal POUT1.

The frequency selector DIP may be a passive or active element with additional power amplifiers as illustrated in FIG. 3. FIG. 3 depicts an exemplary diplexing traveling wave amplifier as frequency selector DIP. The frequency selector DIP comprises several power amplifiers PA3, several first type transmission line elements TL1 and several second type transmission line elements TL2. The input terminal PIN and the first and second output terminal POUT1, POUT2 may be represented by particular resistors R which are electrically coupled to a reference potential GND.

The first type transmission line elements TL1 are for example right handed structures (RH-TL) with each being operable to shift a phase of a signal dependent on the signal's frequency. Each first type transmission line element TL1 may for example be a conventional transmission line representing telegraph equations.

The second type transmission line elements TL2 may be for example composite right/left handed meta-material-structures (CRLH-TL) with each being operable to predetermine a slope and phase of a signal dependent on the signal's frequency.

Furthermore, such transmission lines may be dimensioned in such a way that a signal transportation direction depends on the signal's frequency.

The frequency selector DIP according to FIG. 3 comprises multiple transmission line units TLU, with each comprising a first type transmission line element TL1 and a second type transmission line element TL2 with both transmission line elements being electrically coupled in parallel. The transmission line units TLU are electrically coupled in series and by this are operable to dampen or amplify a signal dependent on the particular phase response of the first and second type transmission line element. The particular phase response is dependent on the signal's frequency and dependent on the dimension of the particular first and second type transmission line element TL1, TL2 of each transmission line unit TLU.

Due to this behavior of the first and second type transmission line elements TL1, TL2, the first signal S_1 associated to the first frequency band is separated from the driver signal S_DR and is provide at the first output terminal POUT1 of the frequency selector DIP. On the other hand, the signal parts of the driver signal S_DR associated to the second frequency band are damped in such way, that a power of the second signal S_2 provided at the first output terminal POUT1 is significantly lower than a power of the first signal S_1. Furthermore, the second signal S_2 is provided at the second output terminal POUT2 with a power significantly higher than the power of the first signal S_1 at the second output terminal POUT2 of the frequency selector DIP. The power amplifiers PA3 may be traveling wave amplifiers or transistor amplifier circuits.

The first signal S_1 and the second signal S_2 are provided to the first power amplifier stage PA1 of the first power amplifier branch and to the second power amplifier stage PA2 of the second power amplifier branch, respectively.

In a further embodiment, the power amplifier circuit DIPPA may comprise a triplexer as frequency selector DIP. By this, the frequency selector DIP comprises three output terminals POUT1, POUT2, POUT3, each being electrically coupled to a particular power amplifier branch.

Figure 4:
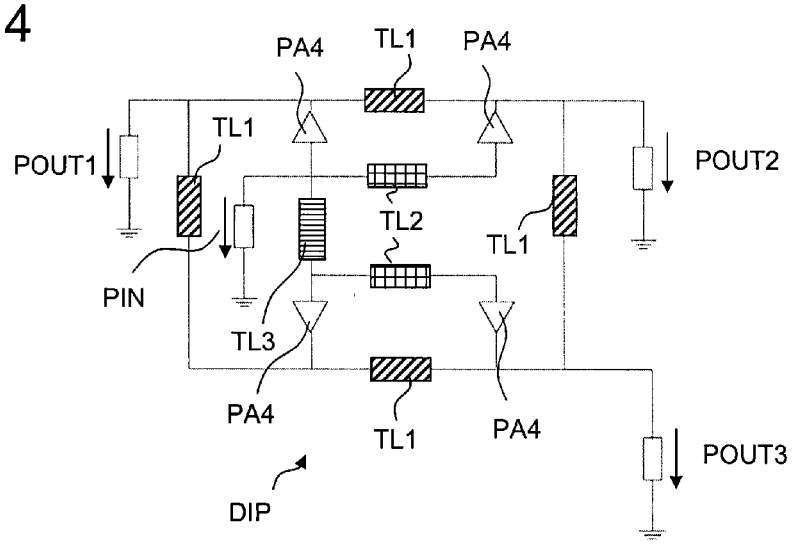

FIG. 4 depicts an exemplary embodiment of a triplexing traveling wave amplifier which may be used as frequency selector DIP. The frequency selector DIP further comprises a first, second and third type transmission line element TL1, TL2, TL3, wherein the first and second transmission line element TL1, TL2 may be identical to the first and second transmission line elements as described according to FIG. 3.

The third type transmission line element TL3 may also be a composite right/left handed meta-material-structure (CRLH-TL) which is operable to predetermine a slope and phase of a signal dependent on the signal's frequency. Compared to the second type transmission line element TL2, the third type transmission line element TL3 may differ in its magnitude and phase response. The first type transmission line element TL1 may have low pass characteristics while the second type transmission line TL2 may have high pass characteristics.

Due to the dampening and amplifying features of the particular first, second and third type transmission line elements TL1, TL2, TL3, the first, second and a third signal is separated from the particular driver signal S_DR provided by the driver stage DR at the input terminal PIN of the triplexer. The first signal is provided at the first output terminal POUT1 with a power significantly higher than the power of the second signal and third signal. The second signal is provided at the second output terminal POUT2 with a power significantly higher than the power of the first signal and third signal. And the third signal is provided at the third output terminal POUT3 with a power significantly higher than the power of the second signal and third signal. The optional power amplifiers PA4 may be traveling wave amplifiers or transistor amplifier circuits.

Alternatively, the power amplifier circuit DIPPA may comprise more than three power amplifier branches and a multiplexer as frequency selector DIP with more than three output terminals. The number of output terminals of the frequency selector DIP preferably corresponds to the number of power amplifier branches.

Each of the first and second power amplifier branch comprises a single input and output terminal. The input terminal and output terminal of the first power amplifier branch is coupled to an input terminal and an output terminal of the first amplifier stage PA1, respectively. The input terminal and output terminal of the second power amplifier branch is coupled to an input terminal and an output terminal of the second amplifier stage PA2, respectively.

Each of the first amplifier stage PA1 and second power amplifier stage PA2 of the power amplifier circuit DIPPA may be a narrow-band amplifier (FIG. 2). By this, the first power amplifier stage PA1 is dimensioned with respect to the associated first signal S_1 to be amplified and the second power amplifier stage PA2 is dimensioned with respect to the associated second signal S_2 to be amplified. Due to the limited amount of components arranged behind the particular power amplifier stage PA1, PA2 in transmit direction, the particular first signal S_1 or second signal S_2 can be amplified and transmitted very efficiently. Additionally, the arrangement of the at least first power amplifier stage PA1 and the second power amplifier stage PA2 contributes to decreasing RF and DC losses and higher efficiency due to increased harmonic tuning, i.e. harmonic suppression.

The first power amplifier stage PA1 is operable to provide the first amplified signal S_A1 at its output terminal and the second power amplifier stage PA2 is operable to provide the second amplified signals S_A2 at its output terminal.

Additionally, the first power amplifier branch may comprise a first bypass-path BP1 and the second power amplifier branch may comprise a second bypass-path BP2. Each bypass-path BP1, BP2 is operable to bypass the components, as for example the particular power amplifier stage, of the particular power amplifier branch, for example in a low-power mode of the front end circuit FEM. By this, the particular first signal S_1 or second signal S_2 may be routed directly to the input terminal of the particular duplexer LBDUP, HBDUP in the low-power mode without passing the particular power amplifier stage PA1, PA2. In the low-power mode the first power amplifier stage PA1 and/or second power amplifier stage PA2 may be decoupled from a supply voltage of the wireless communication device, by this reducing the total power consumption of the front end circuit FEM.

The first power amplifier stage PA1 and second power amplifier stage PA2 may be traveling wave amplifiers in a particular narrow-band configuration. But also other known narrow-band power amplifiers may be used.

In further embodiments the components of the power amplifier circuit DIPPA may be implemented as a single-chip implementation or as a multi-chip-implementation or in a multi-technology implementation, depending on the tradeoffs of performance, cost, etc. The freedom to choose the chip and technology implementation applies for the active components, as for example transistors, as well as for the passive components, as for example inductors.

The present examples and embodiments are to be considered as illustrative and not restrictive, and the invention is not to be limited to the details given herein, but may be modified within the scope and equivalence of the appended claims.

Reference Numerals

ADIP antenna multiplexer
ANT common antenna
BP1 first bypass-path
BP2 second bypass-path
DIP frequency selector
DIPPA power amplifier circuit
DR driver
FEM front end circuit
GND reference potential
HBDUP second duplexer
LBDUP first duplexer
PA1, PA2 power amplifier stage
PA3, PA4 power amplifier
PIN input terminal
POUT1, output terminals
POUT2,
POUT3
R resistor
S_1 first signal
S_2 second signal
S_A1 first amplified signal
S_A2 second amplified signal
S_DR driver signal
S_R receive signal path
TL1, TL2, transmission line elements
TL3
TLU transmission line unit
TXRX transceiver

The invention claimed is:
1. A power amplifier circuit for wireless communication devices, comprising:
a driver stage with an input terminal and output terminal, the driver stage being applicable to provide a preamplified driver signal at its output terminal dependent on a predetermined transmit signal at its input terminal, a frequency selector with an input terminal and at least two output terminals, the frequency selector being electrically coupled to the output terminal of the driver stage via its input terminal and being operable to separate at least a first signal and a second signal from the driver signal, whereas the first signal is associated to a first predetermined frequency band and the second signal is associated to a second predetermined frequency band, at least a first power amplifier branch and a second power amplifier branch with each comprising an input terminal and an output terminal, whereas the input terminal of the first power amplifier branch is electrically coupled to the first output terminal of the frequency selector and the input terminal of the second power amplifier branch is electrically coupled to the second output terminal of the frequency selector, whereas the first power amplifier branch is operable to provide a first amplified signal at its output terminal dependent on the first signal and the second power amplifier branch is operable to provide a second amplified signal at its output terminal dependent on the second signal, and a traveling wave amplifier used to constitute the frequency selector and the driver stage.

2. Power amplifier circuit according to claim 1, whereas the driver stage comprises at least one wideband amplifier which is applicable to preamplify the supplied predetermined transmit signal over a wide range of frequencies, whereas the wide range of frequencies covers the at least first and second predetermined frequency band.

3. Power amplifier circuit according to claim 1, whereas the frequency selector comprises at least one power amplifier which is operable to amplify the driver signal and/or the first signal and/or the second signal.

4. Power amplifier circuit according to claim 1, whereas each of the first and/or second power amplifier branch comprises at least one narrow band power amplifier.

5. Power amplifier circuit according to claim 1, comprising at least a first bypass-path and a second bypass-path, whereas the first bypass-path is associated to the first power amplifier branch and the second bypass-path is associated to the second power amplifier branch, whereas the particular bypass-path is operable to bypass the input terminal and output terminal of the particular power amplifier branch.

6. Power amplifier circuit according to claim 1, whereas
the driver stage and the frequency selector, or
the frequency selector and the first power amplifier branch and the second power amplifier branch, or
the driver stage and the frequency selector and the first power amplifier branch and second power amplifier branch are integrated on a single-chip.

7. Power amplifier circuit according to claim 1, further comprising:
at least a first duplexer and second duplexer, each of the first duplexer and second duplexer comprising an input terminal and an output terminal, whereas the input terminal of the first duplexer is electrically coupled to the output terminal of the first power amplifier branch and the input terminal of the second duplexer is electrically coupled to the output terminal of the second power amplifier branch, whereas each of the first duplexer and second duplexer is operable to pass signals from its input terminal to its output terminal, and
a common antenna being electrically coupled to the output terminal of the first duplexer and to the output terminal of the second duplexer.

8. Power amplifier circuit according to claim 1,
wherein the traveling wave amplifier comprises multiple power amplifiers, multiple first type transmission line elements and multiple second type transmission line elements,
wherein each of the first type transmission line elements is operable to shift a phase of a signal dependent on the signal's frequency;
wherein each of the second type transmission line elements is operable to predetermine a slope and phase of a signal dependent on the signal's frequency;
wherein transmission lines including at least one of the first or second type transmission line elements are dimensioned so that a signal transportation direction depends on at least the signal's frequency.

* * * * *